(12) United States Patent
Vollrath et al.

(10) Patent No.: US 6,564,346 B1
(45) Date of Patent: May 13, 2003

(54) ADVANCED BIT FAIL MAP COMPRESSION WITH FAIL SIGNATURE ANALYSIS

(75) Inventors: Joerg Vollrath, Richmond, VA (US); Ulf Lederer, Dresden (DE); Peter Oswald, Lakefield Mews, CT (US); Thomas Hladschik, Glen Allen, VA (US); Zschunke Andreas, Dresden (DE); Rausch Harold, Weixdorf (DE)

(73) Assignee: Infineon Technologies Richmond, LP., Sandston, VA (US)

( * ) Notice: Subject to any disclaimer, the term of this patent is extended or adjusted under 35 U.S.C. 154(b) by 0 days.

(21) Appl. No.: 09/455,855

(22) Filed: Dec. 7, 1999

(51) Int. Cl.[7] .............................................. G11C 29/00
(52) U.S. Cl. ...................................................... 714/723
(58) Field of Search ................................. 714/723, 738, 714/718, 719, 710, 7, 42; 365/200, 201; 382/145

(56) References Cited

U.S. PATENT DOCUMENTS

| | | | | |
|---|---|---|---|---|
| 5,367,620 A | * | 11/1994 | Ito et al. ...................... | 345/467 |
| 5,644,578 A | * | 7/1997 | Ohsawa ....................... | 714/719 |
| 5,844,850 A | * | 12/1998 | Tsutsui et al. .............. | 365/200 |
| 6,035,432 A | * | 3/2000 | Jeddeloh ..................... | 714/710 |

* cited by examiner

Primary Examiner—Albert Decady
Assistant Examiner—Matthew C. Dooley (57) ABSTRACT

A method for providing a compressed bit fail map, in accordance with the invention includes the steps of testing a semiconductor device to determine failed devices and transferring failure information to display a compressed bit map by designating areas of the bit map for corresponding failure locations on the semiconductor device. Failure classification is provided by designating shapes and dimensions of fail areas in the designated areas of the bit map such that the fail area shapes and dimensions indicate a fail type.

33 Claims, 10 Drawing Sheets

ADVANCED BIT FAIL MAP COMPRESSION WITH FAIL SIGNATURE ANALYSIS

BACKGROUND

1. Technical Field

This disclosure relates to semiconductor testing and more particularly, to bit map compression with the capability for fail signature analysis for bit fail maps for semiconductor memories. The present invention may also be employed for general data compression in other fields.

2. Description of the Related Art

Semiconductor testing is needed for quality control of both manufacturing processes and the product itself. Testing provides an understanding of the type of defects and their location on a semiconductor wafer. Memories give fail locations during electrical tests, since each memory cell has an X, Y coordinate on the chip. Defects in the memory array will cause these memory cells to fail, which are then detected by the electrical tests.

Actual defects are determined using electrical tests after the chips are fabricated. After electrical testing, some chips with defects may be salvaged by employing redundancies. Prior to employing the redundancies pre-fuse yield data may be obtained to determine if redundancies are needed or would improve yield.

A full bit map technique or a fail vector technique may be used to generate locations of failures. A full bit map approach generates a huge amount of data for example, 64 Mbit, 256 MBit, etc. depending on the chip size, which are difficult to store and to process. Signature analysis is slow due to the large amount of data to process. A fail vector memory generates an address for every fail during testing. A cell failing three read operations in a pattern is stored as three fail vectors, for example. Each fail vector has the address of the failure and the input/output pin (DQ) information saved. For example, in a 64M memory, 26 bits are needed for the address of the failure.

A compressed bit fail maps for the fail vector memory approach needs 64*32+3*16*16=2816 bit storage space for a 64 Mbit chip with 3 failures. This is equivalent to 2816/26=108 fail vectors. A failing DQ, a failing bitline (BL) or wordline (WL) will cause overflow of the fail vector memory due to the number of fail vectors and the enormous amount of memory needed to store the vectors. This also makes exact fail signature determination very difficult. Consequently other fail information is lost.

Therefore, a need exists for a bit map compression method and apparatus for reducing the amount of storage capacity needed for storing failure information for semiconductor memory devices. A further need exists for providing failure analysis capability for the bit map compression method and apparatus.

SUMMARY OF THE INVENTION

A method for providing a compressed bit fail map in accordance with the present invention includes testing a semiconductor device to determine failed devices, transferring failure information to display a compressed bit map by designating areas of the bit map for corresponding failure locations on the semiconductor device. Failure classification is provided by designating shapes and dimensions of fail areas in the designated areas of the bit map such that the fail area shapes and dimensions indicate a fail type.

In alternate methods, the step of providing failure classification may include the step of determining a resolution of the fail area dimension for each failure type such that the resolution is sufficient to display a given number of fail types. The step of providing failure classification by designating shapes and dimensions of fail areas may include designating rectangular areas in a display to represent a plurality of different fail types in a memory array. The step of transferring failure information to display a compressed bit map may include logically combining physical addresses of failures to determine a display address in which to map the failure on the compressed bit map. The method may include the steps of determining a physical address which identifies a location of a first cell failure wherein the fail type designates the size and the dimension of remaining cell failures associated with the first cell failure, and eliminating other address information for the remaining cell failures to reduce memory storage. The step of providing failure classification by designating shapes and dimensions of fail areas may include the step of generating a plurality of compressed bit maps by employing scaling parameters to adjust the resolution of the maps, and designating additional addresses for the compressed bit maps to differentiate failures in overlapping areas of the compressed bit fail map to identify a physical address of the fail type. The method may include the step of employing a probability calculation to determine a physical address of a failure. The method may include the steps of calculating redundancies by generating a row map and a column map to identify failures in rows and columns, respectively, of a memory array, replacing the failed rows and columns, compressing the row map and the column map to generate a subarray map to identify memory cell failures in the memory array and replacing the memory cell failures. The step of transferring failure information to display a compressed bit map may include translating physical addresses of failures to determine display addresses in which to map the failure on the compressed bit map. The translating may be performed by employing a switch network, a lookup table or an equation.

Another method for generating a compressed bit fail map includes the steps of providing a semiconductor memory device under test, determining physical addresses of failed memory cells in a memory array of the device under test, the physical addresses being determined by generating a test sequence and running the test sequence a plurality of times to generate a plurality of compressed bit fail maps. The compressed bit fail maps are generated by: transferring failure information to display a compressed bit map by designating areas of the bit map for corresponding failure locations on the semiconductor device and providing failure classification by designating shapes and dimensions of fail areas in the designated areas of the bit map such that the fail area shapes and dimensions indicate a fail type.

In alternate methods, the test sequence may be altered by a scrambling device and the step of generating a different scramble setup for generating each of the plurality of compressed bit fail maps may be included. The method may include step of generating the test sequence by a pattern generator.

The above methods may be implemented using a program storage device readable by machine, tangibly embodying a program of instructions executable by the machine to perform method steps for generating a compressed bit fail map.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides bit map compression with the capability for fail signature analysis. Conventionally, full bit fail maps of a memory chip are stored and analyzed for fail signatures. The present invention reduces the needed storage space by a factor greater than about 100 times and permits fail signature analysis and real fail address determination. The present invention will now be described in greater detail by employing an illustrative example of a 64 Megabit (Mbit) synchronous dynamic random access memory (SDRAM). It is to be understood that the present invention is not limited to the illustrative example and may be employed with other memory chips using bit fail maps.

Figure 1A:
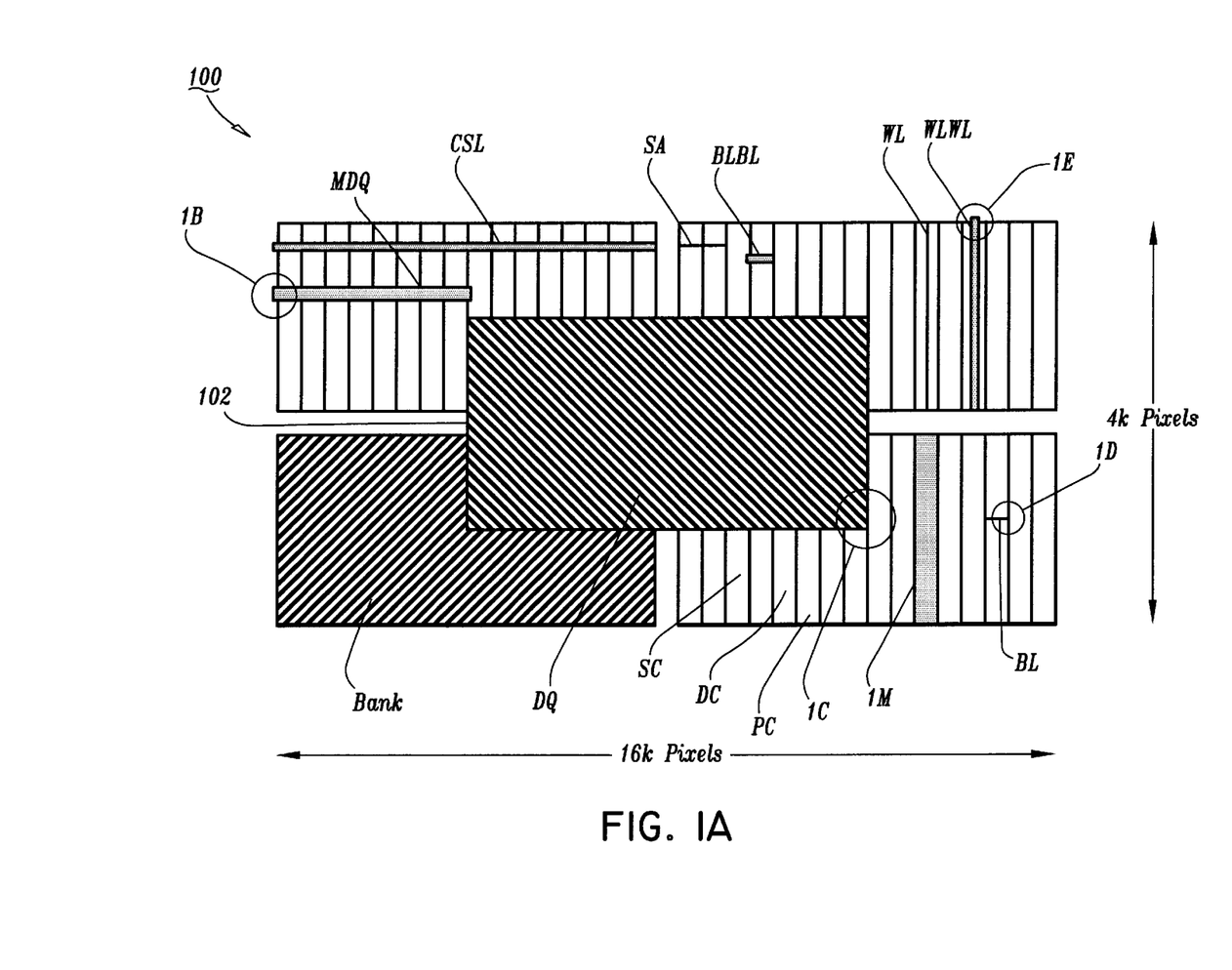
FIG. 1A is a schematic diagram showing position and fail types of different components of a semiconductor memory device for employing the present invention.
Figure 1B:
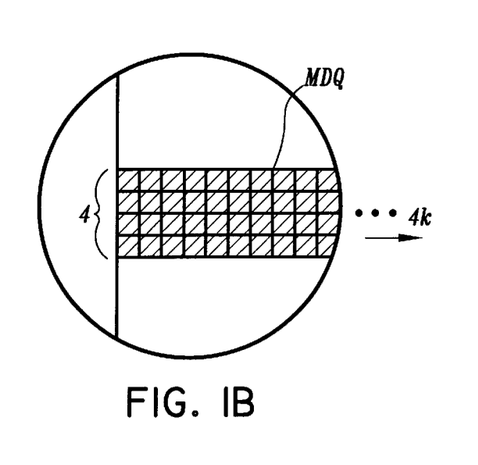
FIGS. 1B–1E are magnified views of the regions indicated in FIG. 1A in accordance with the present invention.

Referring now in specific detail to the drawings in which like reference numerals identify similar or identical elements throughout the several views, and initially to FIG. 1A, a schematic diagram of a portion of a memory chip 100 is shown in accordance with the invention. The present invention selects particular addresses to store in the bit fail map. The bit fail map compression of the invention drops device addresses and uses only particular device addresses for a compressed bit fail map. These particular addresses are addresses of failed devices in a region of a particular fail type which give an indication of the actual failure addresses. A list of known fail types, the number of fail types and their signature are employed to setup the compression method. An example for this compression method will be shown for an 64 Mbit SDRAM as described previously.

The 64 Mbit SDRAM will be used to describe fail categories based on the architecture of the SDRAM. From the architecture, fail categories can be deduced. The 64M SDRAM includes 4 banks with 16 1Mbit blocks each with 512 word lines (WL) and 2048 half bit lines (hBL). Sense amplifiers (SA) are shared between adjacent 1M segments. Column select lines (CSL) activate 4 sense amplifiers (SA). Master data lines (MDQ) transfer data to secondary sense amplifiers (SSA). 16 data inputs and outputs (DQ) are used. In a simple fail model all of these lines can be stuck at a certain value or shorted to a neighboring line or device. WLs can fail or be shorted with an adjacent WL (WLWL short). Full bit lines (BL) or half bitlines (hBL) can fail, or can be shorted to the adjacent bit line (BLBL short). Single cells (SC), paired cells (PC), where two cells share the contact to the bit line, and shorted cells (DC) can fail.

FIG. 1A shows an overview of the 64M SDRAM With different fails. FIG. 1A represents 16 k pixels in x direction and 4 k pixels in y direction. This totals 64 Mbit pixels one for each bit (physical memory cell). 16 k pixels in x direction can be addressed by 14 addresses X0 ... X13. 4 k pixels in y direction can be addressed by 12 addresses Y0 ... Y11. Table 1 gives the fail types and the x, y dimensions of the failing area on a bit map. FIGS. 1B–1E shown magnified views of mapped failures as indicated by labels 1B–1E in FIG. 1A.

TABLE 1 x, y dimensions of fail types in a 64M 16k × 4k bit map. The x and y dimensions give the relative size or dimensions of the fail region for a particular fail type.

| | Failure type | x | y | Comment |
|---|---|---|---|---|
| 1 | Bank | 8k | 2k | One Quadrant |
| 2 | DQ | 4k | 2k | 4 times for each quadrant every 4$^{th}$ y address |
| 3 | 1M segment | 512 | 2k | |
| 4 | MDQ | 4k | 128 | Every 4$^{th}$ y address |
| 5 | CSL | 8k | 4 | |
| 6 | WLWL | 2 | 2k | |
| 7 | WL | 1 | 2k | |
| 8 | SA | 1k | 1 | |
| 9 | BLBL | 512 | 2 | |
| 10 | BL | 512 | 1 | |
| 11 | PC | 2 | 1 | |
| 12 | DC | — | B | 2 cells, 2 cells apart |
| 13 | SC | 1 | 1 | |

In accordance with the invention, a compressed bit fail map should include enough information to distinguish between the fail categories selected for the map. Other fail categories may be employed instead of or in addition to the categories outlined in Table 1 depending on the architecture of the chip or additional failure modes which may be present.

Figure 1C:
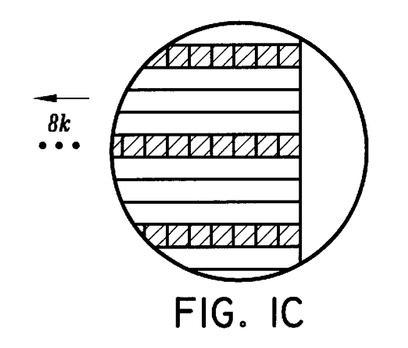
Figure 1D:
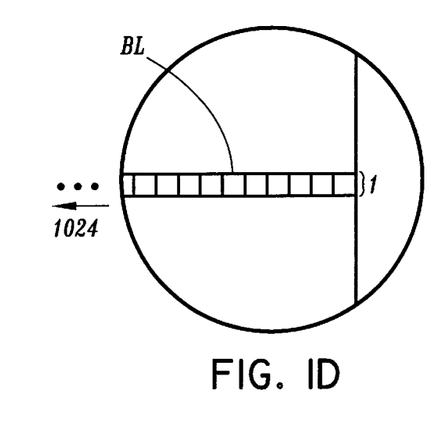
Figure 1E:
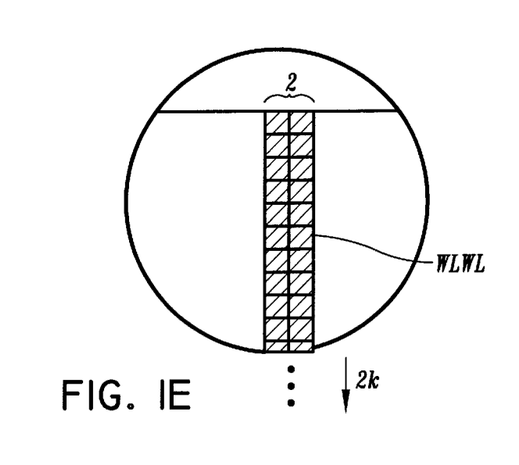
Figure 2:
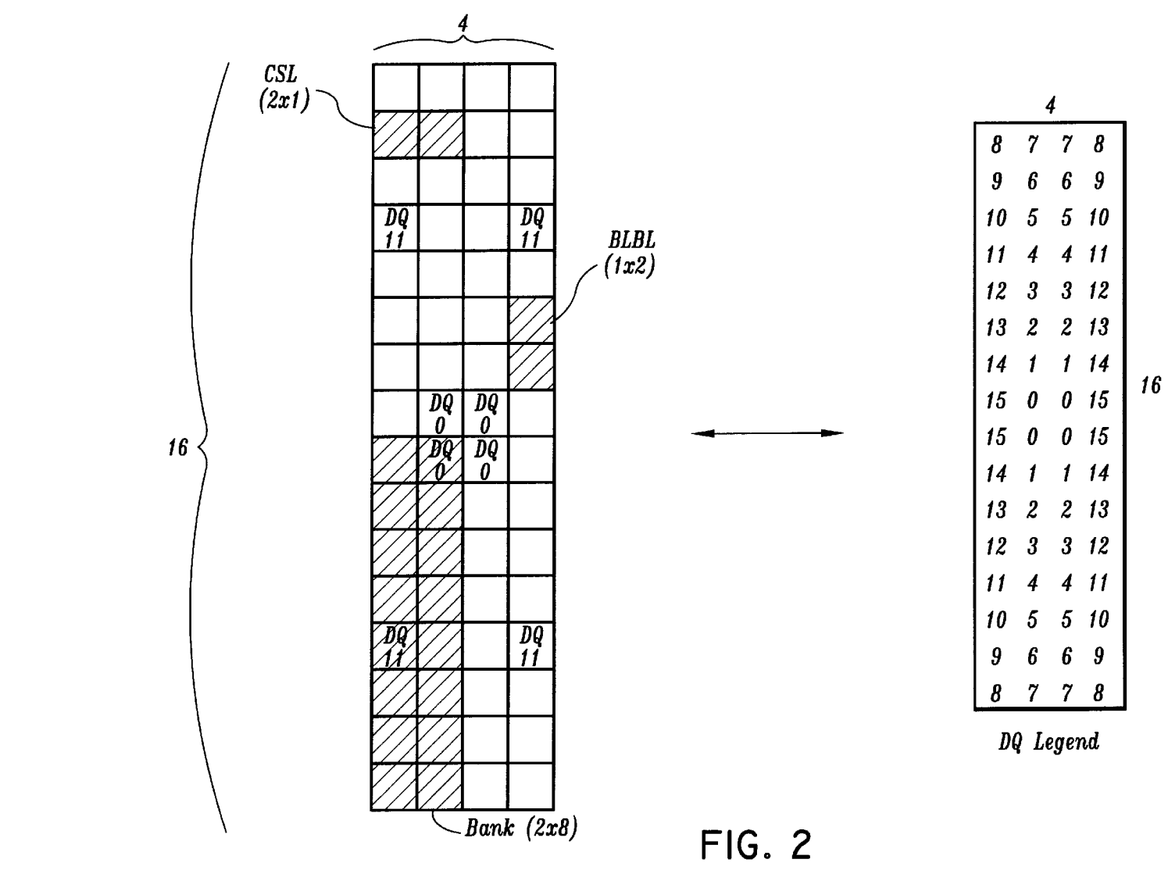
FIG. 2 is a compressed fail bit map and DQ legend with a resolution of 4 by 16 for designating 5 fail types in accordance with the present invention.

The resolution of the map is selected based on the information, which is to be conveyed or stored. For example, if 5 failure types are to be indicated, 4 by 16 pixels may provide sufficient resolution for identifying the failure types. As shown in FIG. 2, construction of the compressed bit fail map of the present invention can start with any fail type. For this example, DQ fails and bank fails are considered first. The central shaded area 102 of FIG. 1A represents a physical region where 4 DQs have failed. Memory cells selected by 4 DQs are usually next to each other in the vertical direction on a chip (FIG. 1C). In a bit fail map, such as the one shown in FIG. 2, four pixels represent each DQ. To distinguish between the banks, 4 areas including 16 DQs are needed. Numbers indicating predetermined locations for failures of DQs are indicated in the Legend of FIG. 2. One number (1–16) represents one DQ. For failed DQ0 and DQ11, spaces labeled DQ0 and DQ11 are indicated in bit map 121. In this way, a compressed fail bit map for a DQ includes 4 pixels in a 4 by 16 pixel map, i.e., each DQ is represented by four pixels. A failing DQ sets 4 pixels in the compressed map. A failing bank sets 16 pixels in one quadrant of the compressed map.

The compressed map is also checked for other fail types. For example, failing CSLs set two horizontal adjacent pixels in the map. As shown in FIG. 1A, the CSL has failed across the entire block in the first quadrant. Therefore, the two horizontal adjacent pixels extend across the first quadrant of the compressed bit map. BLs and BLBL shorts are covered as two vertical adjacent pixels. Summarizing the basic map permits classifying 5 different fail types, DQ fails, bank fails, CSL fails, BL fails and BLBL fails. Each failure is represented by a particular address which is representative of the region which has failed. For example, the bank fail may be represented by a single address on any cell within the bank. Since it is known, the size and location of the bank, only a single cell address need be indicated to identify the failed bank. This holds for the other failed devices as well. For example, a failed CSL affects four cells in the vertical direction (y) and about 8,000 cells in the horizontal (x) direction. Given these dimensions and the shape of the CSL failure region, to identify the CSL physical location only a single address need be specified. For example, an address of a highest row cell in the affected fail area. This identifies the exact location of the failed CSL. However, to distinguish the other fail categories, the map of FIG. 2 has to be expanded to a higher resolution.

Figure 3:
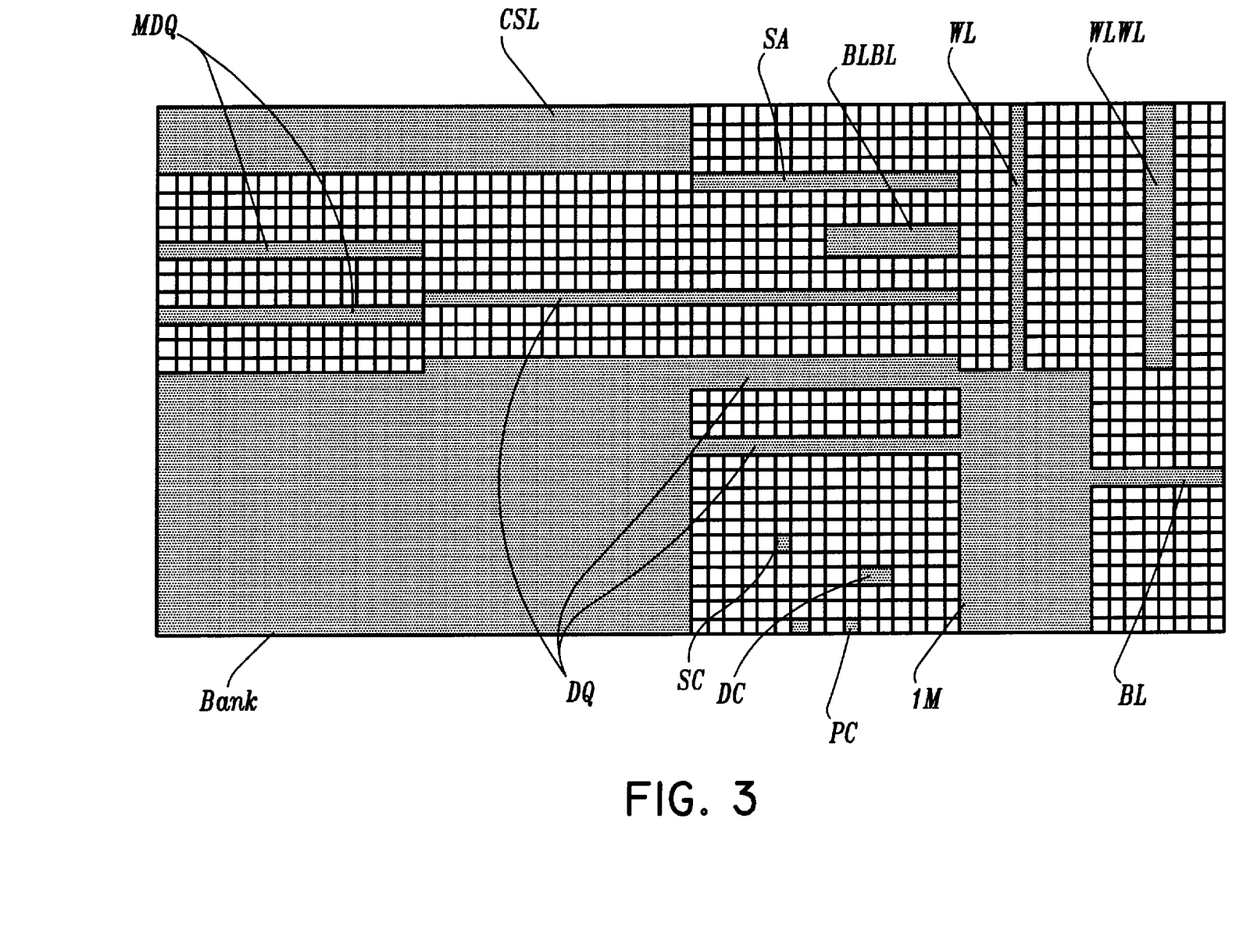
FIG. 3 is a compressed bit fail map having a resolution of 64 by 32 for designating 13 different fail types in accordance with the present invention.

Referring to FIG. 3, a higher resolution compressed bit fail map is shown. The map shown in FIG. 3 has a resolution of 64 by 32 pixels; however the resolution relies on the number of fail categories that need to be displayed. Considering a 1M segment fail, the WL and the WLWL short, each pixel has to be expanded from the FIG. 2 resolution to include 4 horizontal pixels. A 1M fail is thereby indicated as 4 by 16 pixels, a WLWL as 2 by 16 pixels and a failing WL as 1 by 16 pixels. With this setup, different fail patterns for SCs and BLs are also generated to increase the number of fail categories available. For PC and DC fails, the map has to be expanded by a factor of two. MDQ fails expand this by a factor of 2 horizontally and a factor of 2 vertically over the resolution in FIG. 2. As mentioned, the final resolution of FIG. 3 is 64 by 32 pixels to accommodate the fail types indicated in Table 1. An example of how to construct a simple bitmap to compress 64 Mbits to distinguish SC fails, WL fails and BL fails will be described. A single cell (SC) failing is represented by one pixel for example at address x=2048=00100000000000 (boolean all X13, . . . X0 addresses) and y=128=00010000000 (boolean all y11 . . . Y0 addresses). A word line (WL) is represented by one certain x address X0 . . . X13. For the y address y11 determines whether the WL is in the upper or lower half. 2 k pixels fail for all combinations of Y0 . . . Y10 addresses. A (BL) is represented by 512 pixels for 512 failing next to each other for a certain y address.

FIG. 3 shows different fail types marked as black areas. The shape of the fail and the dimension of the fail makes fail classification possible. Since the compressed bit fail map is small a simple pattern recognition program can be written to classify the fail types.

Table 1 gives the x and y dimension of each fail type. As described above, knowing the size and shape of the failure as well as a characteristic address or addresses provides not only a record of failures, but the location of the failures in the array.

There are many benefits of employing a compressed map. By the present invention, a 64 Mbit device can be compressed to 64*32 (=2048) bits. This is a tremendous memory savings, i.e., by a factor of 32,000! A pattern recognition algorithm can be implemented with less computational overhead and greater speed than on systems employing prior art 64 Mbit maps. Further, automation of the analysis of wafers and whole lots of wafers becomes feasible.

By the present invention, address information of failed devices is advantageously retained. These include device addresses (failed devices): 4 addresses for 16 DQS (D0 . . . 3), 2 addresses for 4 bank select (B0 . . . 1), 12 row addresses (X0 . . . 11) and 8 column addresses (Y0 . . . 7). (26 addresses are needed for 64 Mbits (=$2^{26}$), 4x addresses for DQs, 2 addresses for banks, 12x addresses and 8y addresses (26= 4+2+12+8)). Scrambling techniques translate these addresses to physical addresses (P) of 16 k times 4 k pixels. There are 14 physical x addresses (PX0 . . . 13) and 12 physical y addresses (PY0 . . . 11) (14+12=26). An illustrative compressed bit map with 64 by 32 pixels has 6 display (D) x addresses (DX0 . . . 5) and 5 display y addresses (DY0 . . . 4).

Scrambling provides translation between device addresses and physical addresses. A simple example for address translation may include:

PX0=D0; PX1=D1; PX2=D3; PX3=B0; PX4=X0; PX5= X1; PX6=X2; PX7=X3; PX8=X4; PX9=X5; PX10= X6; PX11=X7; PX12=X8; PX13=X9; PY0=D2; PY1= Y0; PY2=B1; PY3=Y1; PY4=Y2; PY5=Y3; PY6=Y4; PY7=Y5; PY8=Y6; PY9=Y7; PY10=X11; PY11=X10, where each physical address is a function of the device address. Logical operations may also be used for translation, for example PY11=X10 XOR X11. The display of the map should display the physical memory cell in a corresponding location or predetermined location (if for example, a lookup table or algorithm are employed for translation), for example, a memory cell in the device which failed in the upper left corner of the device should be displayed in the upper left corner of the display.

The present invention may be implemented in hardware or software. The translation between physical and display addresses for a software solution will now be described. For the above-mentioned example, relevant or characteristic addresses are to be determined for failed devices. This is preferably provided in a top down approach. For example, the bank select for the failed bank is the highest order physical x and y address: DX5=PX13, DY4=PY11. These highest order or highest value addresses provide the physical location of the failed bank as well as the corresponding display address. Highest order addresses, i.e., PX13, refer to highest indices of the address, for example, 13,12,11. Low order refers to, 0,1,2, for example. By designating these addresses all other addresses are disregarded and are not stored. Taking the four failed DQs into account results in the translation of 4 addresses: DX4=PX12 XOR PX13 (exclusive OR is employed due to mirroring, i.e., symmetry), DY0=PY0 XOR PY11, DY1=PY1 XOR PY11, and DY3=PY10. The missing display pixel value, DY2, can be arbitrarily chosen from (PY2 . . . PY10). For example: DY2=PY5. It should be noted that the mapping from physical addresses to display addresses may be performed by a plurality of different methods. For example, an algorithm may be employed to map the display pixels (compressed map) from failed device addresses. Other mapping techniques may include Boolean operations between failed device addresses to determine a display address, hardware implemented solutions such as transistor or switch arrays with switches set connecting a physical address line to a display address line. Lookup tables may also be employed to transfer a physical address to a display address.

For the low order display x addresses, the SC and WL decoding is important: DX0=PX0, DX1=PX1, DX2=PX2. Address DX3 should be selected to decode the lower 1M segment address to allow for SA and MDQ recognition, for example, DX3=PX9.

The compression device or method reads a 64 Mbit bit map in. For each failing cell, the physical address value is generated and translated to a display value where the fail is set, i.e., at a designated location in the compressed map. In one example, this is equivalent to an >OR=operation for the fails which differ in one of the dropped addresses. Compression may include the following translation of addresses:

DX0=PX0; DX1=PX1, DX2=PX2, DX3=PX9 DY0=PY0 XOR PY11; DY1=PY1 XOR PY11; DY3=PY10; DY2=PY5

Some physical addresses P . . . are not used. All fails which have the same (PX0, PX1, PX2,PX9, PY0,PY11,PY1,PY10, PY5) address will be transferred to the same D . . . (display) address in accordance with the methods outline above. This is similar to an OR operation of for these fails. In other words, a bank failure is determined by ORing the failure information for addresses of all cells in the bank. During the OR' operation, compression can be calculated taking fails and fail patterns in the compressed map into account. For example, a bank failure is displayed by blocking out all pixels in the display in an entire quadrant (FIG. 1A).

Figure 4:
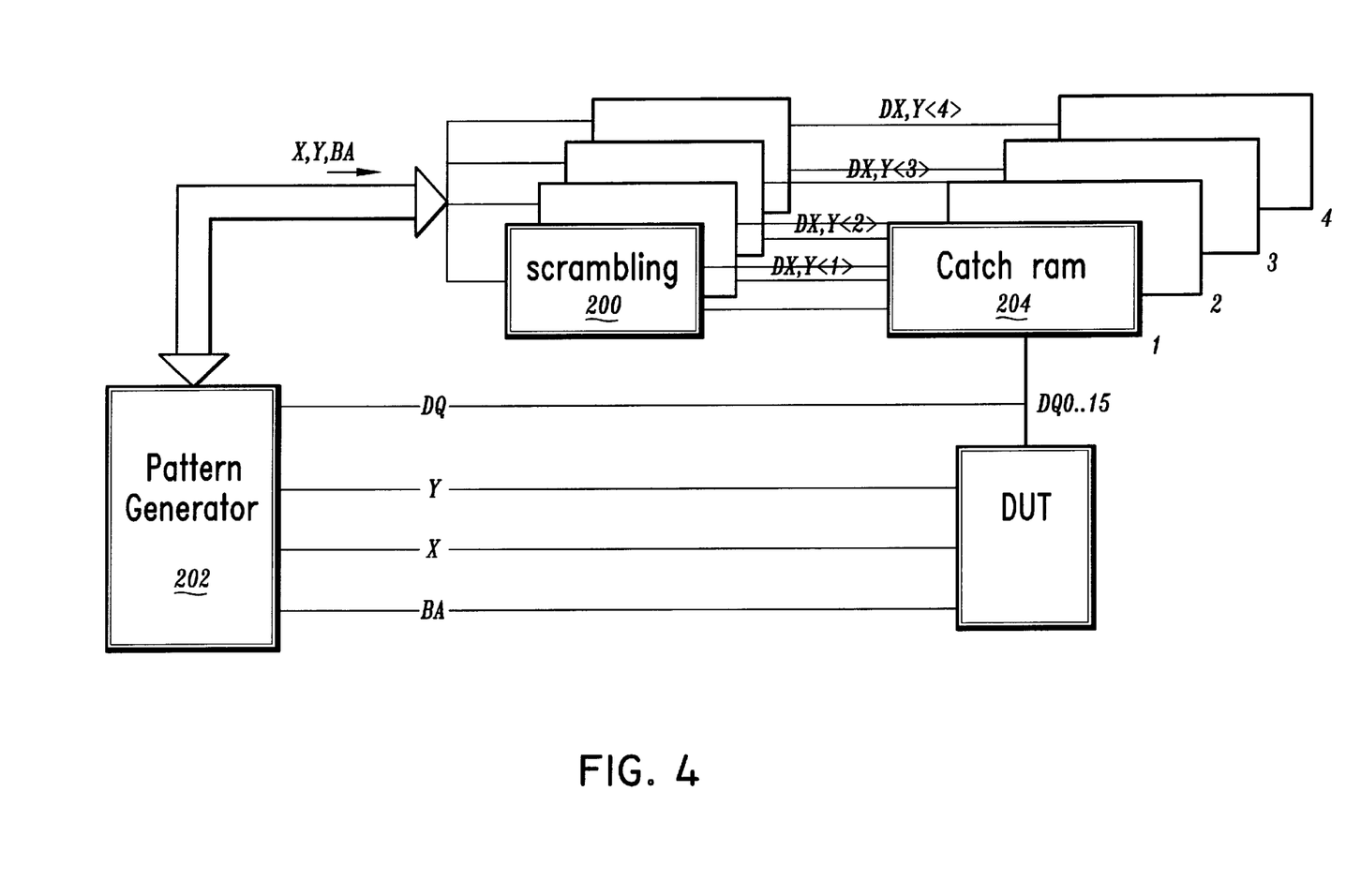
FIG. 4 is a block diagram of a test setup for employing testing in accordance with the present invention.

Referring to FIG. 4, a physical set up for hardware compression is shown. The arrangement includes a device under test (DUT) which may include a semiconductor memory device, such as a DRAM, SRAM, or other memory chip. Inputs to DUT and scrambler 200 include an X and a Y address and a bank address (BA). These inputs may be supplied to DUT by scrambling device 200, from a pattern generator 202 or from pattern generator 202 directly. Scrambling device 200 may be employed to order or manipulate address information input to DUT. Catch random access memory (catch RAM) 204 is employed to record the scrambled test pattern from scrambling device 202 and compare the pattern to the output of the tested DUT. A DQ address enable is provided for addressing DQs during testing. Catch RAM 204 may also be employed to store the results of the test in a compressed map in accordance with the invention. If it is not possible to generate the bit maps in parallel, a sequential approach can be employed using the stored information in catch RAM. In a preferred embodiment, a test sequence is run two or more times to provide two or more compressed bit maps. Three compressed bit maps is preferred. Each time the test sequence is run a different scramble set up is used to generate one of the compressed maps in accordance with the invention.

Figure 10:
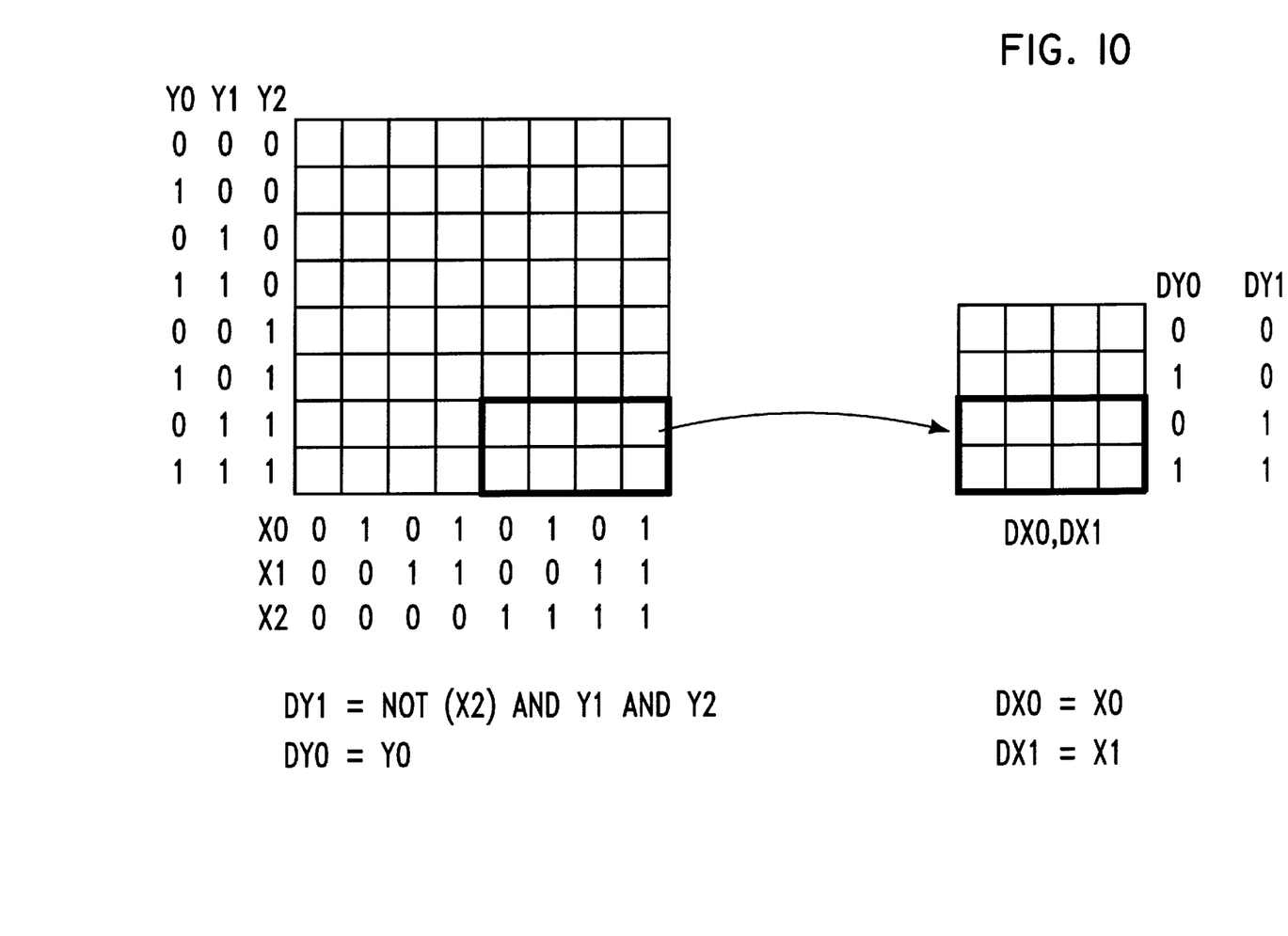
FIG. 10 is a illustrative example showing translation of failures to a compressed bit map for display in accordance with the present invention.

Adding an address comparator to the scramble scheme leads to a zoomed compressed map. The address comparator may be added to the scramble equations or scheme to retrieve only a part of the memory array. Using above compression example, one scramble equation can be modified:

DY3=PY10 AND PY3 AND PY4 AND (NOT PY5) AND PY5; the part where PY10, PY3,PY4 and PY5 are 1 and PY5 is 0 will generate DY3=1. All other addresses will be mapped to DY3=0 In the compressed map for DY3=1 a zoomed area were the original address has PY10,PY3,PY4,PY5=1 and PY5=0 is mapped as shown in FIG. 10 showing how a section of the original array is mapped to the compressed map retaining the same size.

Only a sub region of the memory array is stored in a compressed map. This is particularly useful if a large number of fails are present. Limiting the area of fails in the compressed map prevents masking and overlaying of fails from different areas.

The memory savings of this compressed bit map is significant compared to a full bit map. As compared to the fail vector memory approach described above, the compressed bit fail map of the present invention is quite robust and has no problem catching failure information.

A compressed bit fail map of the present invention can be extended to permit extracting of the exact fail address. Physical failure analysis uses this address to determine the exact fail locations on the chip. Physical failure analysis may be done on samples, which have only a small number of fails. This can be, for example, hard failing SCs, bit lines or word lines. The compressed bit fail map may be sparsely populated. This helps in determining the exact address. Since some of the addresses were dropped from the complete bit fail map, they have to be incorporated in the new compression scheme. The invention provides multiple compressed maps using different device addresses. By providing two or more compressed bit maps, the present invention, advantageously, provides fail signature determination by providing the type of failure and physical address information, which indicates the exact position of the failure (s). To study the compressed bit fail map, an original address is mapped against the different compression scrambling schemes.

Figure 5:
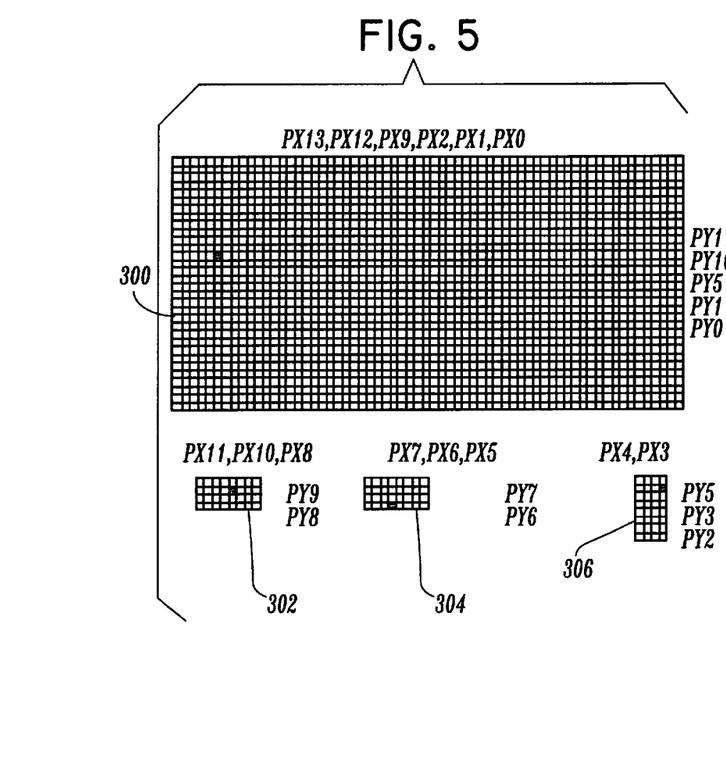
FIG. 5 depicts 4 compressed bit fail maps generated during testing to provide physical fail signatures for identifying exact locations of physical fails in accordance with the present invention.

Referring to FIG. 5, a compressed bit map 300 is shown with a single failure. The 26 addresses of the original map of FIG. 2 have to be split. Four compressed maps 300, 302, 304, and 306 where generated during testing. The first compressed map 300 used 11 addresses (PX13, PX12, PX9, PX2, PX1, PX0, PY11, PY10, PY5, PY1 and PY0) to distinguish different fail types. The remaining 15 addresses can be split. Since 15 can be divided by 3 and 5, 3 maps with 5 addresses each will be chosen. Other variations and map sizes are also contemplated. In FIG. 5, the fail is represented in each of compressed fail maps 304, 306, and 308, and the complete original fail address can be calculated from this information. Compressed, map 302 includes addresses PX11, PX10, PX8, PY9 and PY8, map 304 includes addresses PX7, PX6, PX5, PY7 and PY6, and map 306 includes addresses PX4, PX3, PY5, PY3 and PY2. In this way all addresses are covered by highly compressed maps. FIG. 5 shows an SC fail for this configuration and the address mapping. The failing pixel in each of the compressed maps 304, 306, and 308 gives part of the physical fail address.

This may be performed as follows. A full bit fail map 64 MBit with 26 addresses can be split arbitrarily. This example deals with four maps, i.e., maps 300, 302, 304, 306. Map 300 uses 11 addresses (2 kBit), and maps 302,304,306 use 5 addresses which is 32 bits each. The total space needed for the compressed map is 2 kBit+5*32 bit. The full address for a single cell is generated in the following way. The same failing cell is represented in each map. Each map gives part of the original address. For example, map 300 gives for the SC fail an address PX13,PX12,PX9,PX2,PX1,PX0 of (000101)=5 if 00 is at the upper right corner and PY11, PY10,PY5,PY1,PY0 of (01100)=12. Map 302 gives for the SC PX11,PX10,PX8 of (100)=4 and PY9,PY8 of (01)=1. Map 304 gives for the SC PX7,PX6,PX5 of (011)=3 and PY7,PY6 of (11)=3. Map 306 gives for the SC PX4,PX3 of (11)=3 and PY4,PY3,PY2 of (001)=1. The SC has the original address of PX13,PX12,PX11,PX10 . . . PX0, PY11, PY10, . . . PY0 which is (00100001111101)(010111100100). In this way the full physical address is identified for failure analysis.

Address calculation is only possible with certain fail categories. 2 SC fails can result in 2 fails in each compressed map. For this case, address calculation is difficult and may need further splitting or probability calculations to determine the failure address. Single fail events can be detected easily.

Figure 6:
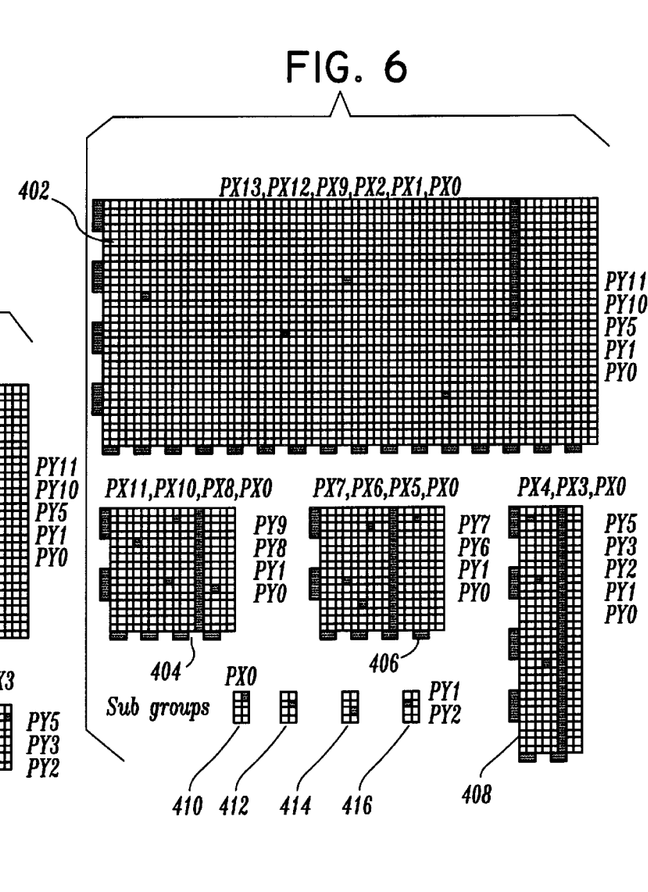
FIG. 6 depicts 4 compressed bit fail maps and four subgroup maps generated during testing to provide physical fail signatures for identifying exact locations of multiple physical fails including overlapping failures in accordance with the present invention.

Referring to FIG. 6, a compressed bit map 400 is shown with multiple failures. To handle multiple failures in a compressed bit map, scaling parameters may be employed to adjust the map size. Scaling parameters provide overlap in addresses for all compressed maps. The same address is used for more than one compressed map. In this example, 3 addresses (PX0, PY0, PY1) are overlapped in the subgroups shown in FIG. 6. Variation of the number of compressed maps and the number of used addresses per map change the maximum number of fails for which exact physical address calculation is possible. To demonstrate this, 4 compressed maps 402, 404, 406 and 408 are taken (FIG. 6) in which an address overlap between 3 of the maps exists. This means addresses are mapped two or more times to provide more detailed identification of fails. In addition, the three smaller compressed maps 302, 304, and 306 from the previous example in FIG. 5 were extended with 1 more x address PX0 and 2 more y addresses (PY0 and PY1) as low order addresses to arrive at maps 404, 406 and 408. This can be viewed as a subgroup 410, 412, 414 and 416. A fail will have the identical pattern in each subgroup. Since 3 addresses give 8 pixels and each pixel can be set, up to 8 SC fail addresses can be determined. This is possible if the position of the SC in the sub group is different in all the maps. Then, the exact address can be determined. The subgroups are determined by the overlapped addresses (here, PX0, PY0, PY1).

Probability calculations for exact address determination, depending on the number of fails, can be performed. For SCs, no fail may have the same position in the subgroup. A subgroup with m positions and n failing cells gives for the probability to distinguish all the fails as: $m/m^*(m-1)/(m-2)/m^* \ldots *(m+1-n)/m$.

As shown in FIG. 6, 4 SCs and one WL are mapped in map 400. The grid provided at the border of the compressed bit map is included to help the viewer identify the position of fails in a sub group. The WL can be identified in all maps. In this example, the WL overlays one SC in one of the maps, i.e., map 406, and only 3 remaining single cells are visible. Still exact addresses for 3 single cells and the WL can be determined, since there are unique sub groups in each window. The pattern in the sub group for each SC fail is shown. The effect of how large fails like WL, WLWL, SA, CSLs and DQs can mask smaller fails and prevent address calculation can be seen. The detection probability can be scaled with the address overlap. A suitable compression setup can be made for certain fail types before the test is run. The setup of the above mentioned example (FIG. 6) is suited for a several SCs, maximum of 8 (due to the 3 addresses PX0,PY0,PY1). To get addresses for more than 8 cells another address has to be introduced for overlap.

For example, PX1 can be added to every map which enlarges every map by a factor of 2. Large overlap permits more fail addresses to be exactly determined. With the address overlap of only 3 for a single BL or a single WL, the exact address can be calculated.

Figure 7:
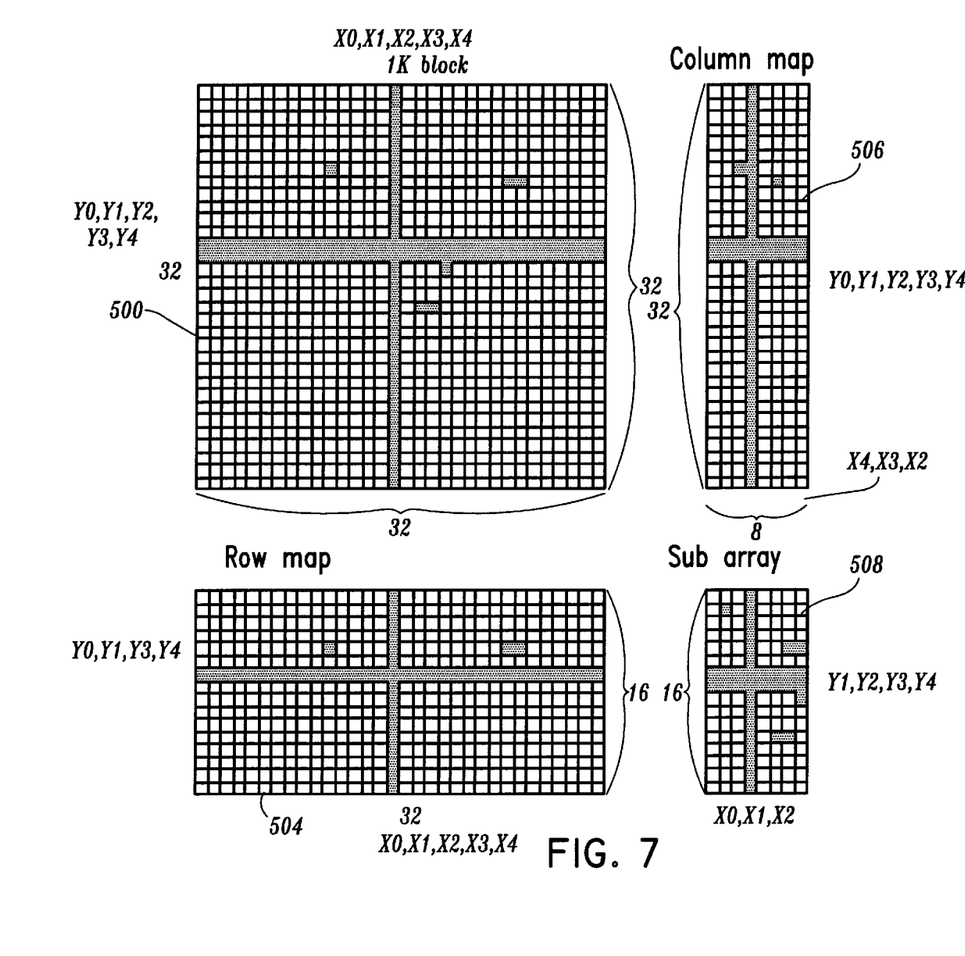
FIG. 7 depicts 4 compressed bit fail maps generated during testing to provide physical fail signatures for determining redundancies which are to enabled to replace failed components in accordance with the present invention.

Referring to FIG. 7, the present invention provides for choosing parameters for the compression to permit redundancy calculations. An example of a 1 Mbit redundancy region with 512 columns (4 cells each) and 512 rows will be used to illustrate the setup. In this example, there are 16 redundant column elements and 4 redundant row elements. A conventional approach would use a 1 Mbit catch RAM to store the fails during testing and use a specialized algorithm to determine a redundancy solution.

For the efficient bit fail map compression of the present invention three maps are used in addition to a compressed bit map 500 of the 1 k block. One map 504 with the full row address space and a reduced column address space (row map: 32 times 16 and another map 506 with the full column address space and limited row addresses (column map: 32 times 8). Map 500 shows the original array. Maps 504, 506, and 508 show the compressed maps for redundancy calculation. The same fails from the original map 500 are shown in the compressed maps 504,506, and 508. For larger arrays the gain is greater.

The numbers are generated to have one full address range in the x and y direction and then 2 to 4 times the number of redundant elements. This ensures that for all possible repairable fail configurations, sufficient information is gathered. A WL fail would wipe out one column in the compressed column map. The additional columns allow detection of all fails.

To enable localization of additional fails at a WL column crossing another compressed map is needed. This generates a 16 by 8 pixel sub array 508. The compressed row address map and the compressed column address map give the position of a cross fail. Since the cross fail wipes out a column and a row, a sub array 508 has to provide detailed information in this region for additional neighboring fails. Two failing SCs would set two fail pixels in each giving four possible repair address combinations. The third map 508 is used to determine the correct addresses of the two SC fails. Address calculation is done as for the SC example above. Since rows or columns are repaired, only x addresses have to be determined for rows and y addresses for column repair. This gives more flexibility for using columns or rows for repair.

Bit fail map 500 is employed to obtain compressed maps 504, 506 and 508 of the present invention which are employed for calculating redundancies. For a redundancy calculation, either a column or a row is taken first. In the compressed column map 506, all failing columns are disregarded. In the compressed row map 504, all failing rows are disregarded. The corresponding fails are repaired with columns and rows. Then the smaller fails are repaired in one compressed map and eliminated in the other. Some of the benefits include less catch fail memory and faster redundancy processing.

Figure 8:
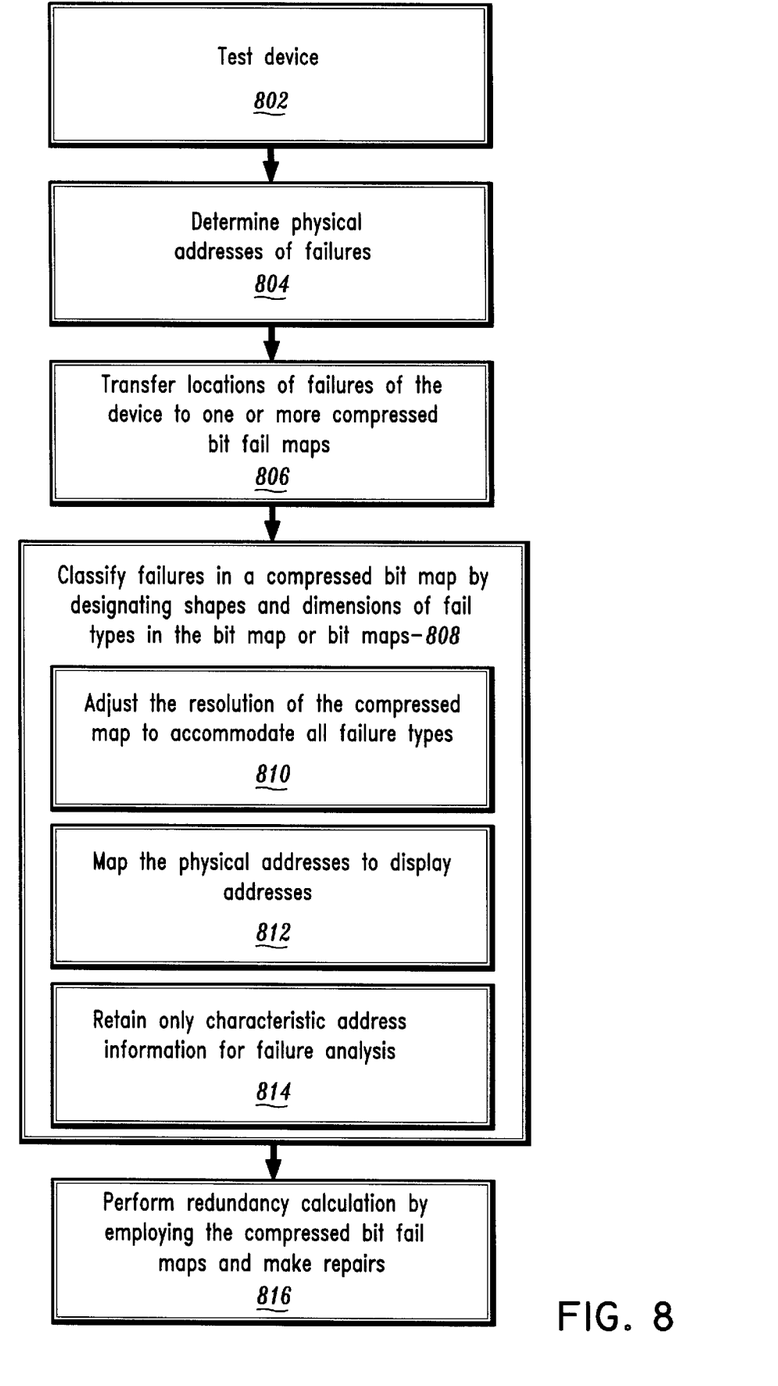
FIG. 8 is a block/flow diagram of a system/method for generating compressed bit maps in accordance with the present invention.
Figure 9:
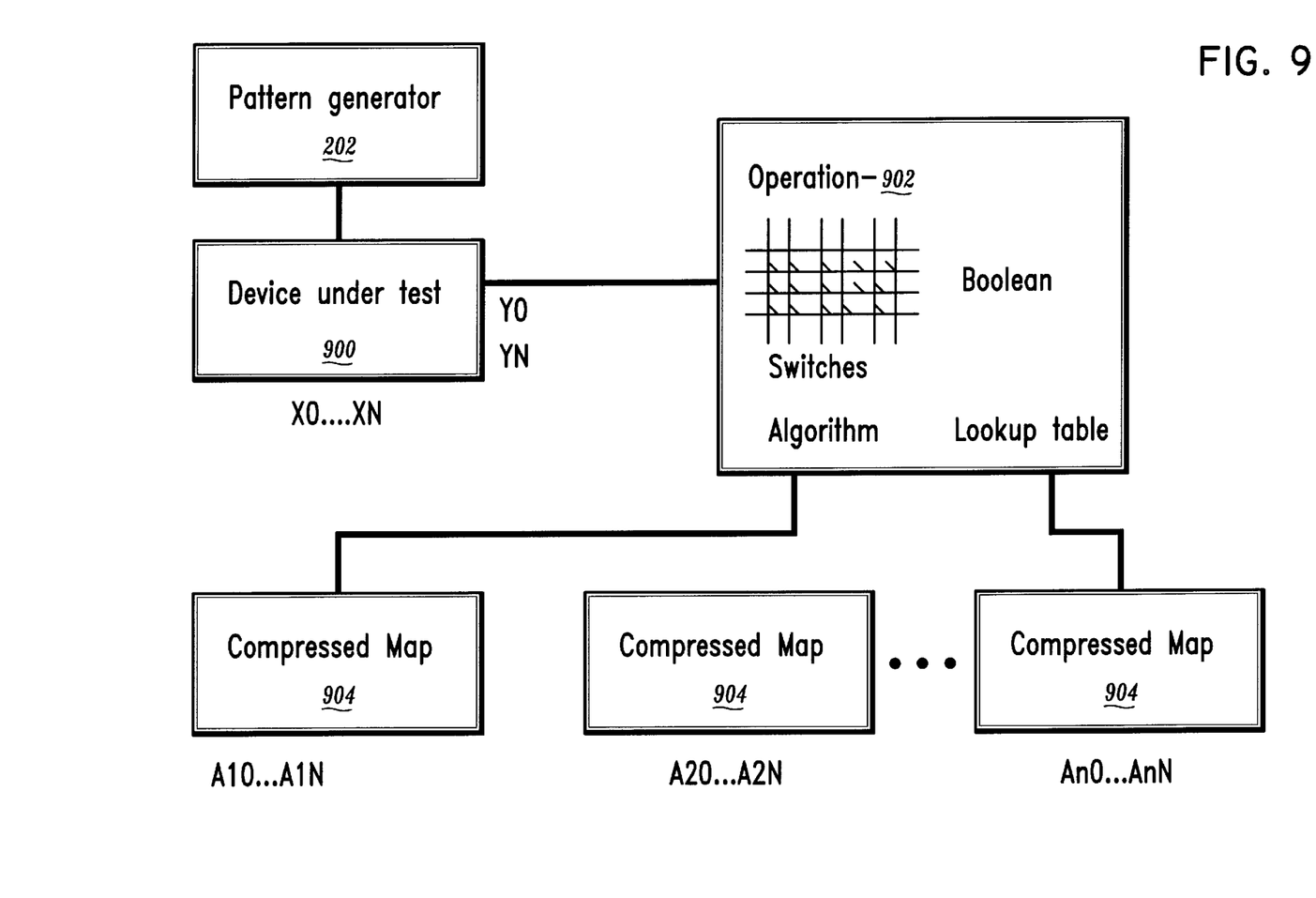
FIG. 9 is a schematic diagram showing an overview of compresses bit map generation by employing multiple subsets of addresses.

It should be understood that the elements shown in FIGS. 8 and 9 may be implemented in various forms of hardware, software or combinations thereof. Preferably, these elements are implemented on one or more appropriately programmed general purpose digital computers having a processor and memory and input/output interfaces. However, switching arrays and logic/Boolean operations may be performed using hard wired devices. One preferred embodiment is a hardware implementation of the scrambling transfer of physical addresses to compressed bit map addresses on one or more planes. During memory testing addresses are generated and scrambled addresses for one or more bit maps are generated. Failing cells are stored during testing with the addresses for the compressed maps. The resulting compressed maps are then transferred to a computer for further signature analysis.

Referring now to FIG. 8, a block/flow diagram is shown for a system/method for providing a compressed bit fail map in accordance with the present invention. In block 802, a semiconductor device is tested to determine failed devices. Testing is preferably performed by employing the setup shown in FIG. 4. A scrambling device 200 may preferably be configured to provide only the compressed bitmaps as outputs during testing (FIG. 4). In block 804, physical addresses of failed memory cells and/or components in a memory array of the device under test are determined. The physical addresses are preferably determined by generating a test sequence and running the test sequence a plurality of times to generate a plurality of compressed bit fail maps. However, a single compressed bit map can also be produced. The compressed bit fail maps are provided by transferring failure information to display a compressed bit map by designating areas of the compressed bit map for corresponding physical failure locations on the semiconductor device, in block 806, such that regions in the compressed bit map correspond to relative locations of failures on the semiconductor device. In block 808, failure classification is performed by designating shapes and dimensions of fail areas in the designated areas of the bit map such that the fail area shapes and dimensions indicate a fail type. Fail types may include single cell failures, paired cell failures, CSL failures, sense amplifier failures, bank failures, etc. Failure classification may employ a recognition program for identifying shapes and dimensions in the compressed bit fail map(s). In block 808, a plurality of compressed bit maps may be generated by employing scaling parameters to adjust the resolution of the maps. These additional compressed bit maps may be generated at the time of testing by designating additional addresses for the compressed bit maps to differentiate failures in overlapping areas of the compressed bit fail map and to identify a physical address of each failure. A probability calculation may also be employed to determine a physical address of a failure in the case of overlapping failures in the compressed bit map.

Block 808 may include block 810 for determining a resolution of the fail area dimension for each failure type such that the resolution is sufficient to display a given number of fail types. Since the resolution of the map determines the number of distinct failure classes, which may be displayed, it is advantageous to reduce the resolution to a smallest possible value for a given compressed bit map. The resolution of the failures in the compressed bit map may be displayed by designating shapes and dimensions of fail areas as rectangular areas in a display to represent a plurality of different fail types in a memory array. In block 812, physical addresses are mapped to display addresses. This may be performed by logical combinations (e.g., ORing, inverting address information) of physical addresses of failures to determine a display address in which to map the failure on the compressed bit map. Further, an algorithm or lookup table may be employed to perform the mapping.

In block 814, a physical address which identifies a location of a first cell failure is designated wherein the fail type designates the size and the dimension of remaining cell failures associated with the first cell failure. Other address information may be eliminated for the remaining cell failures to reduce memory storage.

In block 816, redundancies may be calculated by generating a row map and a column map to identify failures in rows and columns, respectively, of a memory array. The failed rows and columns are then replaced. The row map and the column map may be further compressed to generate a subarray map to identify memory cell failures in the memory array so that memory cell failures can also be replaced.

Referring to FIG. 9, a schematic diagram of a system/method for generating compressed bit fail maps in accordance with the present invention is shown. A semiconductor wafer or device under test 900 includes a map space S of x and y address information, i.e., $X0 \ldots XN$ and $Y0 \ldots YN$. The wafer 900 is tested to determine failures by receiving patterns from a pattern generator 202. The map S is then compressed by employing an operation in block 902. Operation 902 may include an algorithm, a boolean operation, a lookup table, or hardware such as a switch array to convert addresses to display addresses in a plurality of compressed bit maps 904. The display addresses in each of the compressed bit maps 904 include a subset of the address space of wafer 900. Further, the display addresses need only include characteristic address information of failures and other addresses may be dropped from storage to save storage space in accordance with the invention.

Having described preferred embodiments for a advanced bit fail map compression with fail signature analysis (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for providing a compressed bit fail map comprising the steps of:

testing a semiconductor device to determine failed devices;

transferring failure information to display a compressed bit fail map by designating areas of the bit fail map for corresponding failure locations on the semiconductor device; and providing failure classification by designating shapes and dimensions of fail areas in the designated areas of the bit fail map such that the fail area shapes and dimensions indicate a fail type.

2. The method as recited in claim 1, wherein the step of providing failure classification includes the step of determining a resolution of the fail area dimension for each failure type such that the resolution is sufficient to display a given number of fail types.

3. The method as recited in claim 1, wherein the step of providing failure classification by designating shapes and dimensions of fail areas includes designating rectangular areas in a display to represent a plurality of different fail types in a memory array.

4. The method as recited in claim 1, wherein the step of transferring failure information to display a compressed bit map includes logically combining physical addresses of failures to determine a display address in which to map the failure on the compressed bit map.

5. The method as recited in claim 1, further comprising the steps of:

determining a physical address which identifies a location of a first cell failure wherein the fail type designates the size and the dimension of remaining cell failures associated with the first cell failure; and eliminating other address information for the remaining cell failures to reduce memory storage.

6. The method as recited in claim 1, wherein the step of providing failure classification by designating shapes and dimensions of fail areas includes the step of:
   generating a plurality of compressed bit maps by employing scaling parameters to adjust the resolution of the maps; and
   designating additional addresses for the compressed bit maps to differentiate failures in overlapping areas of the compressed bit fail map to identify a physical address of the fail type.

7. The method as recited in claim 6, further comprising the step of employing a probability calculation to determine a physical address of a failure.

8. The method as recited in claim 1, further comprising the steps of:
   calculating redundancies by:
      generating a row map and a column map to identify failures in rows and columns, respectively, of a memory array;
      replacing the failed rows and columns;
      compressing the row map and the column map to generate a subarray map to identify memory cell failures in the memory array; and
      replacing the memory cell failures.

9. The method as recited in claim 1, wherein the step of transferring failure information to display a compressed bit map includes translating physical addresses of failures to determine display addresses in which to map the failure on the compressed bit map.

10. The method as recited in claim 9, wherein the translating may be performed by employing a switch array, a lookup table or an equation.

11. A method for generating a compressed bit fail map comprising the steps of:
   providing a semiconductor memory device under test;
   determining physical addresses of failed memory cells in a memory array of the device under test, the physical addresses being determined by generating a test sequence and running the test sequence a plurality of times to generate a plurality of compressed bit fail maps;
   the compressed bit fail maps being generated by:
      transferring failure information to display a compressed bit fail map by designating areas of the bit fail map for corresponding failure locations on the semiconductor device; and
      providing failure classification by designating shapes and dimensions of fail-ares in the designated areas of the bit fail map such that the fail area shapes and dimensions indicate a fail type.

12. The method as recited in claim 11, wherein the test sequence is altered by a scrambling device and further comprising the step of generating a different scramble setup for generating each of the plurality of compressed bit fail maps.

13. The method as recited in claim 11, further comprising the step of generating the test sequence by a pattern generator.

14. The method as recited in claim 11, wherein the step of providing failure classification includes the step of determining a resolution of the fail area dimension for each failure type such that the resolution is sufficient to display a given number of fail types.

15. The method as recited in claim 11, wherein the step of providing failure classification by designating shapes and dimensions of fail areas includes designating rectangular areas in a display to represent a plurality of different fail types in a memory array.

16. The method as recited in claim 11, wherein the step of transferring failure information to display a compressed bit map includes logically combining physical addresses of failures to determine a display address in which to map the failure on the compressed bit map.

17. The method as recited in claim 11, further comprising the steps of:
   determining a physical address which identifies a location of a first cell failure wherein the fail type designates the size and the dimension of remaining cell failures associated with the first cell failure; and
   eliminating other address information for the remaining cell failures to reduce memory storage.

18. The method as recited in claim 11, wherein the step of providing failure classification by designating shapes and dimensions of fail areas includes the step of:
   generating a plurality of compressed bit maps by employing scaling parameters to adjust the resolution of the maps; and
   designating additional addresses for the compressed bit maps to differentiate failures in overlapping areas of the compressed bit fail map to identify a physical address of the fail type.

19. The method as recited in claim 18, further comprising the step of employing a probability calculation to determine a physical address of a failure.

20. The method as recited in claim 11, further comprising the steps of:
   calculating redundancies by:
      generating a row map and a column map to identify failures in rows and columns, respectively, of a memory array;
      replacing the failed rows and columns;
      compressing the row map and the column map to generate a subarray map to identify memory cell failures in the memory array; and
      replacing the memory cell failures.

21. The method as recited in claim 11, further comprising a catch random access memory, the method further comprising the steps of storing at least one of generated patterns and compressed bit fail maps in the catch random access memory.

22. The method as recited in claim 11, wherein the step of step of transferring failure information to display a compressed bit map includes translating physical addresses of failures to determine display addresses in which to map the failure on the compressed bit map.

23. The method as recited in claim 22, wherein the translating may be performed by employing a switch array, a lookup table or an equation.

24. A program storage device readable by machine, tangibly embodying a program of instructions executable by the machine to perform method steps for generating a compressed bit fail map, the method steps comprising:
   testing a semiconductor device to determine failed devices;
   transferring failure information to display a compressed bit fail map by designating areas of the bit fail map for corresponding failure locations on the semiconductor device; and
   providing failure classification by designating shapes and dimensions of fail areas in the designated areas of the bit fail map such that the fail area shapes and dimensions indicate a fail type.

25. The program storage device as recited in claim 24, wherein the step of providing failure classification includes the step of determining a resolution of the fail area dimension for each failure type such that the resolution is sufficient to display a given number of fail types.

26. The program storage device as recited in claim 24, wherein the step of providing failure classification by designating shapes and dimensions of fail areas includes designating rectangular areas in a display to represent a plurality of different fail types in a memory array.

27. The program storage device as recited in claim 24, wherein the step of transferring failure information to display a compressed bit map includes logically combining physical addresses of failures to determine a display address in which to map the failure on the compressed bit map.

28. The program storage device as recited in claim 24, further comprising the steps of:

determining a physical address which identifies a location of a first cell failure wherein the fail type designates the size and the dimension of remaining cell failures associated with the first cell failure; and eliminating other address information for the remaining cell failures to reduce memory storage.

29. The program storage device as recited in claim 24, wherein the step of providing failure classification by designating shapes and dimensions of fail areas includes the step of:

generating a plurality of compressed bit maps by employing scaling parameters to adjust the resolution of the maps; and designating additional addresses for the compressed bit maps to differentiate failures in overlapping areas of the compressed bit fail map to identify a physical address of the fail type.

30. The program storage device as recited in claim 29, further comprising the step of employing a probability calculation to determine a physical address of a failure.

31. The program storage device as recited in claim 24, further comprising the steps of:

calculating redundancies by:

generating a row map and a column map to identify failures in rows and columns, respectively, of a memory array;

replacing the failed rows and columns;

compressing the row map and the column map to generate a subarray map to identify memory cell failures in the memory array; and replacing the memory cell failures.

32. The program storage device as recited in claim 24, wherein the step of step of transferring failure information to display a compressed bit map includes translating physical addresses of failures to determine display addresses in which to map the failure on the compressed bit map.

33. The program storage device as recited in claim 32, wherein the translating may be performed by employing a switch array, a lookup table or an equation.

* * * * *